INVENTORS.
WILLIAM M. MC LEAN
KENNETH D. SCHREDER
BY
T. L. Styner
ATTORNEY

United States Patent Office 3,254,308

Patented May 31, 1966

3,254,308

TRANSISTOR AMPLIFIER WITH DEGENERATIVE VOLUME CONTROL UTILIZING A UNIJUNCTION TRANSISTOR

William M. McLean, Rochester, N.Y., and Kenneth D. Schreder, Columbus, Ohio, assignors to General Dynamics Corporation, Rochester, N.Y., a corporation of Delaware Filed June 12, 1963, Ser. No. 287,335

4 Claims. (Cl. 330—28)

This invention relates to amplifier circuits and is particularly directed to volume control means for the amplifier.

Ideally, all electrodes of a transistor amplifier must have fixed optimum biases for high gain, low distortion amplification, yet the output signal level must be kept relatively constant over a wide range of input signal voltages. Volume controls, either manual or automatic, which vary bias voltages from optimum values invariably introduce signal distortion. Clipping circuits for establishing constant output levels cannot be used in many amplifiers because of the distortion introduced by the clipper.

An object of this invention is to provide improved volume control means for amplifiers which overcome the disadvantages of conventional control circuits.

A more specific object of this invention is to provide an improved volume control circuit for amplifiers which permits optimum bias values and minimum distortion over wide ranges of gain control.

Other objects and features of this invention will become apparent to those skilled in the art by referring to the specific embodiment described in the following specification and shown in the accompanying drawings in which.

Figure 1:
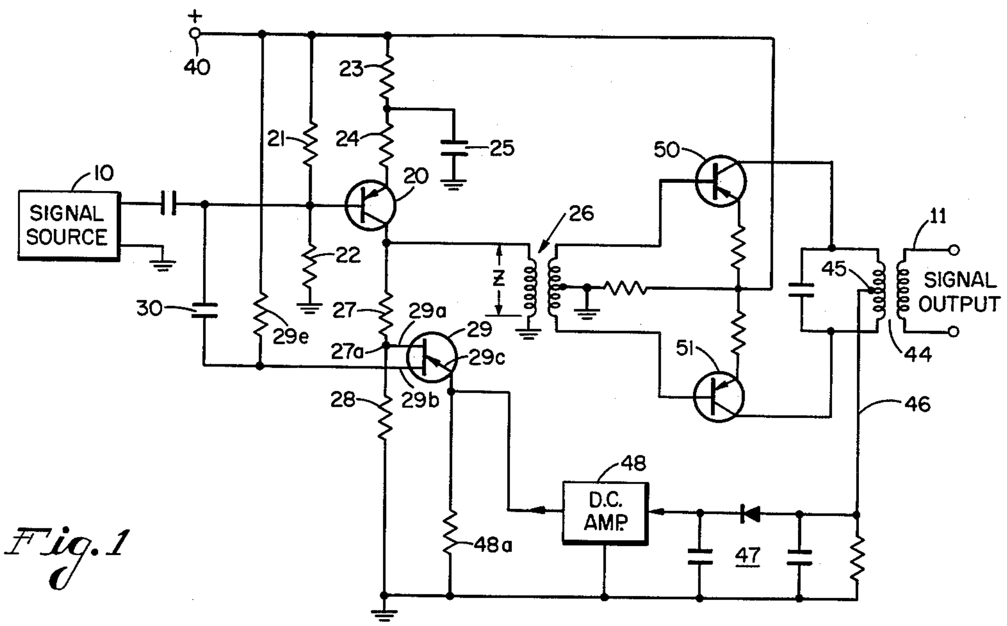
FIG. 1 is a schematic circuit diagram of one volume control embodying this invention.

The amplifier of FIG. 1 must accept the signal from source 10 regardless of a wide range of signal voltages and deliver to output terminals 11 the signal substantially undistorted and, ideally, at a single voltage level. The particular amplifier shown comprises transistor 20 and push-pull transistors 50 and 51 coupled in cascade between the input and output circuits of the system. The particular transistors shown are each of the P-N-P types with the biasing source connected between positive terminals 40 and ground. The bias of the base, or control electrode, of transistor 20 is established by the voltage divider resistors 21 and 22. The common emitter circuit of transistor 20 includes current-limiting resistors 23 and 24 bypassed as shown to ground via condenser 25. The output of transistor 20 comprises the impedance Z of transformer 26 with primary winding connected between the collector, in the configuration shown, and reference ground. The signal voltage across the output impedance is sampled, according to this invention, by the potentiometer including resistances 27 and 28. It is apparent that the signal voltage at any point in the load or on the potentiometer is in phase opposition to the input signal voltage. It is also apparent that if a measured proportion of the sampled signal voltage is applied to the control electrode of the amplifier, the desired negative feedback may be obtained for good distortionless gain control.

According to an important feature of this invention, a variable resistance, with a nonlinear current-resistance characteristic, is connected in series between the output and input circuits of the transistor. For this purpose, it is found that the base-to-base path of the unijunction transistor 29 is well suited. The two base terminals **29*a* and 29*b* are connected between the junction 27*a* intermediate the ends of potentiometer 27–28 and the control electrode of transistor 20. Blocking condenser 30 is connected in the feedback circuit to isolate the bias voltages of the transistors 20 and 29. Base terminal 29*b* is biased via resistor 29*e*. The emitter 29*c* controls the resistance between the base terminals 29*a* and 29*b***.

Figure 2:
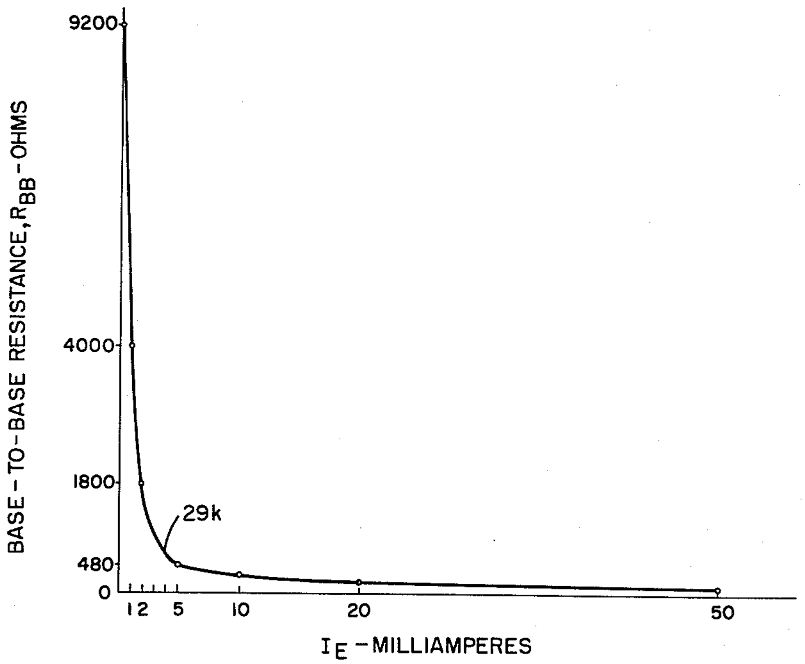
FIG. 2 shows the current-resistance characteristic of a unijunction transistor employed in the circuits of FIG. 1.

In FIG. 2 is shown the functional relation of the emitter current of the unijunction transistor and the base-to-base resistance of the transistor. It has been found that the base-to-base resistance at zero emitter voltage and current is very high and that as the emitter current increases slightly, the base-to-base resistance suddenly drops to a low value, and remains at low resistance values throughout a wide range of emitter currents. This resistance characteristic with the abrupt knee **29*k* is, fortunately, ideally suited as a series control resistance in the negative feedback circuit of amplifier 20**. That is, when the emitter voltage exceeds a small value, the base-to-base resistance drops to a low level and permits near maximum negative signal feedback. Conveniently, emitter voltage may be obtained from a signal detector for automatic gain control.

Figure 3:
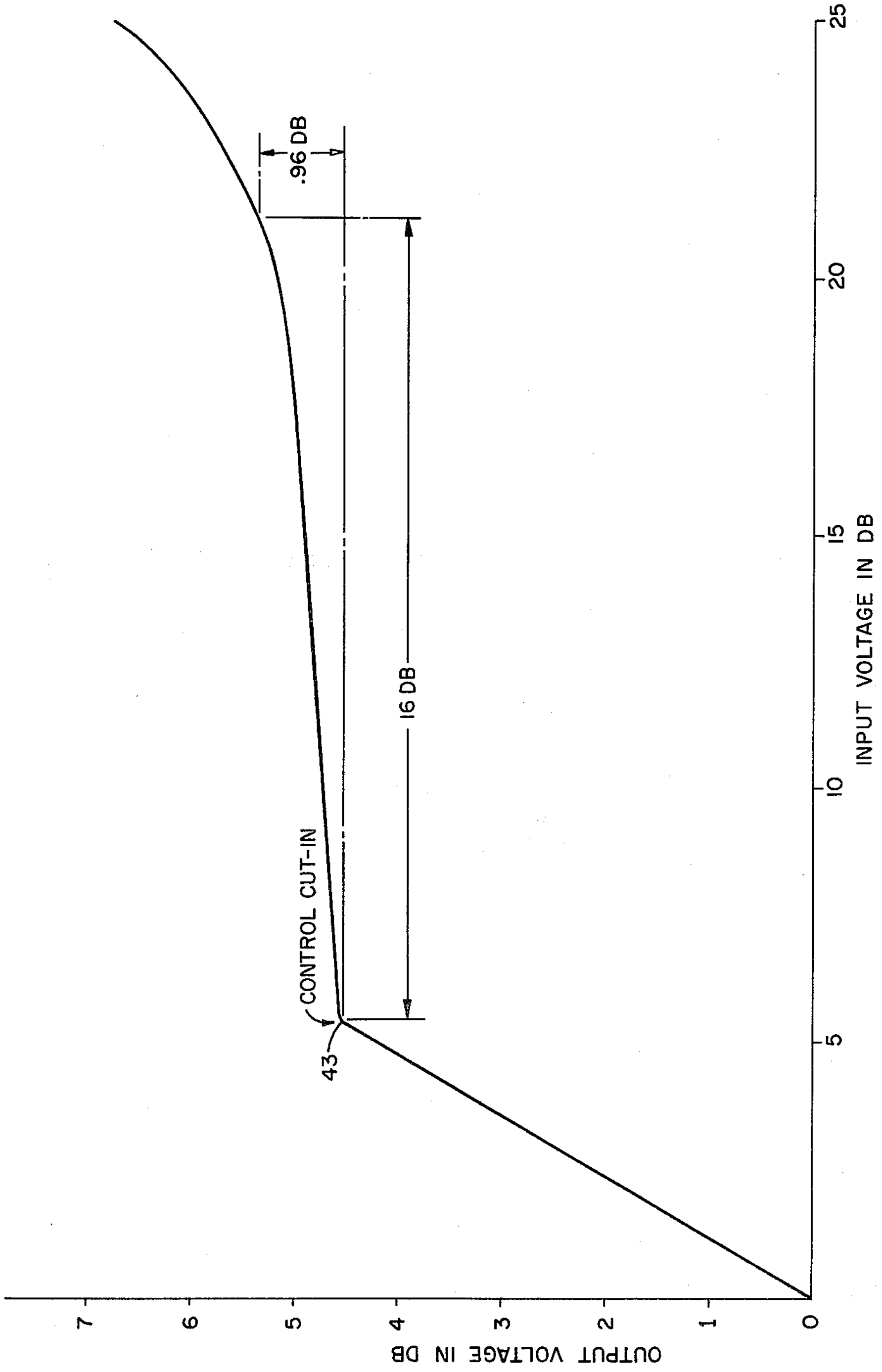
FIG. 3 shows the input-output signal voltage characteristic of the amplifier of FIG. 1.

As shown in the input-output characteristic of FIG. 3, the output voltage of the amplifier rises sharply to the knee 43 at about 5 db above zero and then levels throughout a wide range of input signals to produce a substantially constant output signal voltage. In one amplifier employing the circuits of this invention, an input voltage range of 16 db resulted in an output signal variation of less than .96 db. This gain characteristic is obtained without disturbing the optimum biases on the amplifier electrodes, without clipping action, and without distortion.

One means, shown in FIG. 1, for obtaining the control current and/or voltage of the unijunction emitter **29*c* comprises a circuit for sampling the output voltage via the tap 44 on transformer 45, lead 46, rectifier 47 and direct current amplifier 48. The parameters of the rectifying circuit and the gain of the D.C. amplifier are easily selected to establish the knee 43** at any desired input signal level.

The input-output gain characteristic of FIG. 3 was obtained in the amplifier of FIG. 1 where transistors 20, 50 and 51 were each of the type commercially available as 2N652A and where the unijunction transistor is of the commercially available type known as 2N491. With these semiconductors, the principal components of the circuit of FIG. 1 had the following values:

| | | |
|---|---|---|
| Resistance **21** | ohms | 8.2K |
| Resistance **22** | do | 13K |
| Resistance **23** | do | 1.1K |
| Resistance **24** | do | 68 |
| Resistance **27** | do | 5.1K |
| Resistance **28** | do | 10 |
| Resistance **29*e*** | do | 10K |
| Resistance **48*a*** | do | 1.5K |
| Condenser **25** | microfarads | 45 |
| Condenser **30** | do | 4.7 |

The particular resistance and component values indicated in FIG. 1 have been found to produce the results of FIG. 3. It is apparent, of course, that with other transistor types the specific component values might be altered without departing from the scope of the invention.

What is claimed is:

1. An amplifier having a control electrode, an output electrode and a common electrode, an output load impedance connected in the output circuit of said amplifier, a unijunction transistor with two base electrodes and an emitter electrode in which the base-to-base resistance is a nonlinear function of the emitter current, means for biasing said unijunction transistor so that said transistor presents a low base-to-base resistance for emitter current exceeding a predetermined magnitude, the path of said two bases being serially coupled for signal frequencies between said load impedance and said control electrode of the amplifier, and means coupled to said output circuit for applying a control voltage to said emitter electrode which causes said emitter current to exceed said predetermined magnitude when the output voltage of said amplifier exceeds a certain level to control the level of signal voltage fed back between said output load impedance and said control electrode.

2. A transistor amplifier with a control electrode, an output electrode and a common electrode, an output impedance connected in the output circuit of said transistor, a unijunction transistor with two base electrodes and an emitter electrode, the base-to-base resistance of said unijunction transistor being a nonlinear function of the emitter current, means for biasing said unijunction transistor so that said transistor presents a low base-to-base resistance for emitter current exceeding a predetermined magnitude, a degenerative signal feedback circuit between the output and input circuits of said amplifier, the base-to-base path of said unijunction transistor being connected in series in said feedback circuit and means coupled to said output circuit for applying a control voltage to said emitter electrode which causes said emitter current to exceed said predetermined magnitude when the output voltage of said amplifier exceeds a certain level.

3. A transistor amplifier having a control electrode, an output electrode and a common electrode, a resistor connected in circuit with said output electrode, a signal source connected to said control electrode, a signal output circuit coupled across said resistor, a feedback circuit coupled between a signal-voltage point in said output circuit and said control electrode to degeneratively feed back signal energy, a unijunction transistor with two base electrodes and an emitter electrode, said feedback circuit including the base-to-base variable resistance path of said unijunction transistor, means for biasing said unijunction transistor so that said transistor presents a low base-to-base resistance for emitter current exceeding a predetermined magnitude, and a detector circuit responsive to output signal voltages for generating a biasing voltage proportional to the signal voltage, and means for applying said biasing voltage to the emitter electrode for increasing said feedback signal energy when the output voltage of said amplifier exceeds a certain level.

4. An amplifier with a signal input circuit and a signal output circuit, said output circuit having a point at which the signal voltage is out of phase with respect to the phase of the applied signal in said input circuit, a series resistive feedback circuit connected between said point and said input circuit, a unijunction transistor having a pair of base electrodes and an emitter electrode, said base electrodes being connected in series in said series circuit for controlling the level of negative feedback energy and with a control element means for apply biasing voltage to one of said base electrodes to bias said unijunction transistor into the low resistance region of its base-to-base resistance characteristic when its emitter current exceeds a predetermined magnitude, a detector means responsive to signal level in said amplifier for generating a proportional control voltage, means for applying said control voltage to said emitter electrode, the resistance of said path being a nonlinear function of said control voltage so that said resistance drops from a high to a relatively low value in response to a relatively low control voltage and remains substantially at said relatively low resistance throughout the remainder of the range of control voltage.

References Cited by the Examiner

UNITED STATES PATENTS

| | | | |
|---|---|---|---|
| 2,930,996 | 3/1960 | Chow et al. | 307—88.5 X |
| 2,997,603 | 8/1961 | Isabeau | 328—175 X |
| 3,015,076 | 12/1961 | Sheehan | 330—144 X |
| 3,026,485 | 3/1962 | Suran | 307—88.5 X |
| 3,163,828 | 12/1964 | Fine | 330—29 X |

OTHER REFERENCES

Article by Suran, "Double Base Expands Diode Applications," Electronics, March 1955, pp. 198–202.

ROY LAKE, *Primary Examiner.*

R. P. KANANEN, *Assistant Examiner.*